Figure 1:
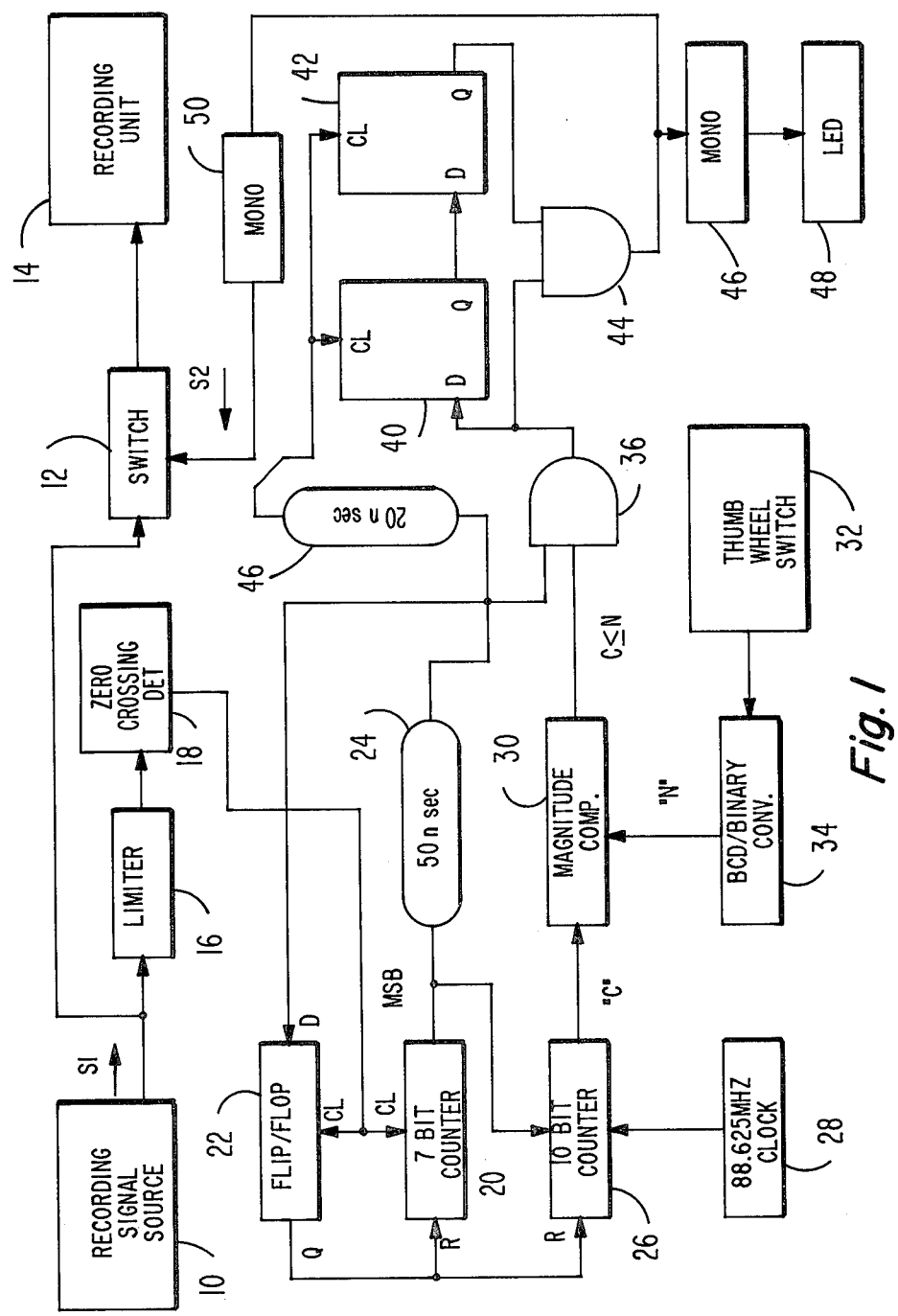

United States Patent [19]

Sheean

[11] Patent Number: 4,476,498
[45] Date of Patent: Oct. 9, 1984

[54] DEVIATION DETECTOR FOR FM VIDEO RECORDING SYSTEM

[75] Inventor: David A. Sheean, Indianapolis, Ind.

[73] Assignee: RCA Corporation, New York, N.Y.

[21] Appl. No.: 346,370

[22] Filed: Feb. 5, 1982

[51] Int. Cl.³ .......................... H03C 3/06; H04N 5/76; G11B 27/36

[52] U.S. Cl. ..................................... 358/330; 369/53; 360/6; 332/18; 332/19; 332/20

[58] Field of Search ............... 358/327, 314, 330, 336, 358/337; 360/6, 38.1; 369/53; 332/18, 19, 20

[56] References Cited

U.S. PATENT DOCUMENTS

| | | | |
|---|---|---|---|
| 3,258,694 | 6/1966 | Shepherd | 332/19 X |
| 3,586,769 | 6/1971 | Luther, Jr. et al. | 358/330 X |
| 3,659,060 | 4/1972 | Wolff et al. | 332/19 X |
| 4,001,496 | 1/1977 | Clemens et al. | 358/127 |
| 4,038,686 | 7/1977 | Baker | 358/127 |
| 4,203,134 | 5/1980 | Christopher et al. | 358/128.5 |
| 4,309,674 | 1/1982 | Owen | 332/18 |
| 4,405,897 | 9/1983 | Taylor et al. | 332/20 X |

Primary Examiner—Robert L. Richardson
Attorney, Agent, or Firm—E. M. Whitacre; P. J. Rasmussen; R. G. Coalter

[57] ABSTRACT

The deviation of an FM signal modulated by a video signal is detected by measuring the average period of the FM signal at a measurement rate proportional to the average frequency of the FM signal. The value of each average period measurement is compared with a predetermined number to produce an indicator signal each time the measured value is less than or equal to the predetermined number. The effect of overshoot of the video signal due to preemphasis is minimized by detecting the successive occurrence of at least two indicator signals to provide a further indicator signal which may be used for visually monitoring video peak levels and/or for protecting a utilization device to which the FM signal is supplied.

8 Claims, 2 Drawing Figures

DEVIATION DETECTOR FOR FM VIDEO RECORDING SYSTEM

This invention relates to recording systems and particularly to peak deviation detectors for use in FM recording system for video signals.

Video disc and video tape systems which employ FM recording techniques are well known. In such systems, excessive deviation of the FM recording carrier can lead to distortion of the signal and may even result in possible damage to the recording transducer. This problem is particularly troublesome where the baseband video signal is subjected to high frequency preemphasis prior to application to the recording signal frequency modulator. While preemphasis provides a desirable signal-to-noise ratio improvement, it tends to create overshoots of the video signal during rapid signal level changes. The overshoots can lead to excessive FM carrier deviation even when the nominal recording level is within acceptable limits.

It is known to limit or clip the baseband video signal prior to the recording signal frequency modulator to minimize the possibility of excessive deviation of the FM carrier. See, for example, U.S. Pat. No. 4,096,513 which issued to M. D. Ross June 20, 1978. Clipping of the baseband video signal, however, does not offer complete protection of the recording transducer from excessive deviation of the recording carrier. A shift in gain or center frequency of the recording modulator, for example, may result in excessive frequency deviation even though the baseband signal may be maintained within acceptable amplitude limits by clipping. For this reason, it is preferable to monitor the FM signal deviation rather than the baseband signal amplitude in applications such as video disc mastering or video tape recording.

Various arrangements have been proposed for detecting excessive deviation of video FM signals in video disc players. See, for example, U.S. Pat. No. 4,001,496 of Clemens et al., U.S. Pat. No. 4,038,686 of A. L. Baker and U.S. Pat. No. 4,203,134 of Christopher et al. In such players, excessive deviation of the FM video signal recovered from a disc record is detected and used to activate a defect masking circuit which substitutes a previously stored video signal for the current video signal when a defect (i.e., excessive FM deviation) occurs.

One might assume that a fast acting FM signal deviation detector suitable for use in a video disc player would also be suitable for use in video disc (or tape) mastering system. This, however, is not the case. Although detection speed is an important consideration in video disc mastering applications, there is a need for improvement in performance in certain other areas. These include, illustratively, accuracy of detection, freedom from drift, and the ability to ignore certain short-term transient effects. The present invention is directed to meeting that need.

In accordance with the present invention, a deviation detector for an FM signal modulated in accordance with a video signal includes means for measuring the average period of the FM signal at a measurement rate proportional to the average frequency of the FM signal. Means are provided for comparing the result of each average period measurement with a predetermined number to provide an indicator signal each time the measured average period is less than or equal to the predetermined number.

In accordance with a further aspect of the invention, the detector includes means for detecting the successive occurrence of at least two of the indicator signals to provide a further indicator signal.

In accordance with yet another aspect of the invention, additional means are provided for comparing the result of each average period measurement with a further predetermined number to provide a control signal each time the measured average period is less than said further predetermined number. The control signal is applied to switch means in the recording signal path of a recording system for effectively interrupting signal flow in the recording signal path when the control signal is present.

Figure 2:
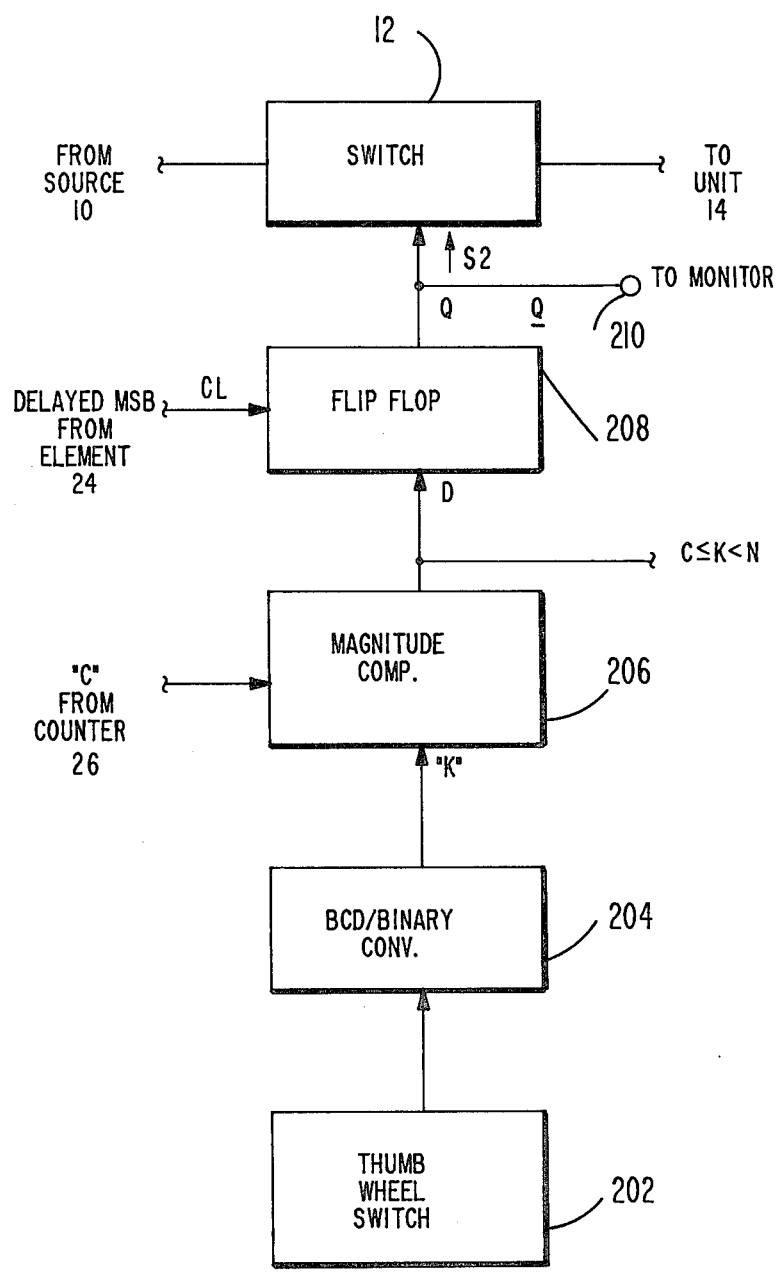

FIG. 1 is a block diagram of a video disc mastering system embodying the invention; and FIG. 2 is a block diagram illustrating a modification of the system of FIG. 1.

The mastering system includes a recording signal source 10 for providing an FM signal S1 modulated in accordance with a video signal to be recorded. The signal S1 is applied via a switch 12 to a recording unit 14. Switch 12 is normally closed for completing the recording signal path between source 10 and unit 14. A control signal S2 is developed, as will be explained, and supplied to switch 12 for interrupting the recording signal path to protect the recording transducer (i.e., the cutterhead of a mastering lathe of unit 14) from being overdriven during certain deviation conditions of the FM video signal S1. For video disc mastering applications, source 10 and unit 14 may be of the kind described, for example, by J. B. Halter in U.S. Pat. No. 4,044,379 entitled "Method and Apparatus for Electromechanical Recording of Short Wavelength Modulation in a Metal Master" which issued Aug. 23, 1977. A preferred system for video disc mastering at less than "real time" rates is shown in U.S. Pat. No. 4,277,796 of M. D. Ross entitled "Slow Down Processor for Video Disc Mastering Using a Special Mode VTR" which issued July 7, 1981.

To detect excessive deviation of the FM recording signal S1, the signal is applied to a limiter 16 which minimizes effects of any amplitude variations. The limited signal is then applied to a zero crossing detector 18 which produces a clock pulse at each axis crossing of the amplitude limited signal. Since two axis crossings occur during each cycle of S1, the clock pulse frequency or repetition rate is thus effectively double the frequency of the FM signal S1. Detector 18 may thus be considered as a "frequency doubler" and provides an advantage in that the time required for subsequent processing is substantially reduced over that which would otherwise be needed for determining the average period of the signal S1.

The clock pulses produced by detector 18 are applied to the clock input (CL) terminals of a seven bit counter 20 and a flip flop 22. The reset input of counter 20 is connected to the true (Q) output of flip flop 22 and the most significant bit (MSB) output of counter 20 is coupled to the data input (D) of flip flop 22 via a delay element 24. The function of counter 20 is to average the clock pulses produced by detector 18 and to develop control signals for subsequent measurement, comparison and sequence recognition circuits. When the sixty fourth clock pulse is counted, the MSB output of counter 20 will go high, thereby priming flip flop 22 to be SET by the next clock pulse. When that occurs, flip flop 22 assumes a SET condition and resets counter 20. This causes the MSB output to go low, thereby priming flip flop 22 to be RESET by the next clock pulse. When flip flop 22 is RESET, its Q output will go low, thereby enabling counter 20 to begin counting clock pulses and the cycle repeats. Accordingly, the time period between the enabling of counter 20 (flip flop 22 reset) and the appearance of the MSB output signal is equal to the average period of 64 counts of the clock pulses produced by detector 18 or 32 full cycles of the FM signal S1. Delay element 24 provides a short delay (e.g., 50 nSec) for the MSB signal to compensate for subsequent processing delays as will be explained.

The period of counter 20 (and thus the average period of signal S1) is measured at a rate proportional to the average frequency of signal S1 by means of a 10 bit counter 26 and a high frequency (e.g., 88.652 MHz) clock 28. Counter 26 is connected at the rest (R) to the Q output of flip flop 22 and is thus reset each time counter 20 is reset so that when the reset signal is removed (i.e., flip flop 22 reset) both counters are primed to start counting. Counter 20 counts the clock pulses produced by detector 18 and counter 26 counts the clock pulses produced by clock 28. The MSB output of counter 20 is connected to the clock inhibit input terminal (INH) of counter 26 so that counter 26 is stopped immediately when the count of counter 20 reaches its full scale value (sixty four). Since the time period between removal of the reset signal from counters 20 and 26 and the appearance of the MSB output of counter 20 is equal to the average of 64 clock pulses of detector 18 (32 cycles of signal S1), the count in counter 26 at the end of each measurement period is therefore directly proportional to the average period of the signal S1. Accordingly, as the frequency deviation of signal S1 increases, the maximum count in counter 26 at the end of each measurement decreases and vice versa.

Each occurrence of excessive deviation of the average FM carrier frequency is detected by comparing the count, C, of counter 26 with a preset number, N, at the end of each measurement period and prior to resetting counters 20 and 26. The number N represents the lowest acceptable average period of the signal S1 and is produced by a two decade digital thumbwheel switch 32 which produces a binary coded decimal (BCD) output signal that is converted to natural binary by means of a BCD-to-binary code converter 34. Comparison of the numbers C and N at the end of each measurement period is provided by an AND gate 36 having one input connected to receive the delayed MSB output of counter 20 and another input connected to the output of a digital magnitude comparator 30 to which the "C" and "N" binary signals are applied. The delay provided by element 24 provides sufficient time for the magnitude comparator to "settle" at the end of each measurement period before gate 36 is primed. If, at that time, the count C is less than or equal to N then gate 36 will be enabled and will provide an output pulse signifying that the average period of signal S1 is less than or equal to the desired minimum value. Conversely, if the count C is greater than N, gate 36 will not be enabled. This represents the condition that the average period of 32 cycles of the signal S1 is greater than the minimum value.

The setting of switch 32 determines the threshold level of the detector and is dependent on the maximum desired frequency deviation of signal S1, the frequency of clock 28 and the maximum count of counter 20 as follows. Assume that it is desired to detect average frequency deviations of the signal S1 which equal or exceed 3.15 MHz. This frequency exemplifies a 100 IRE white level signal in a half-rate mastering system such as that proposed in the aforementioned Ross patent. The period of a 3.15 MHz signal is about 317.46 nanoseconds and the period of the clock pulses produced by clock 28 is about 11.28 nanoseconds. Counter 20 enables counter 26 for 32 full cycles of the signal S1 which corresponds to about 10,159 nanoseconds when S1 averages 3.15 MHz. During this period counter 26 will count 90 of the 11.28 nanosecond clock pulses of clock 28. If the frequency of signal S1 is greater than 3.15 MHz, counter 26 will be enabled for a shorter time than 10,159 nanoseconds and so fewer clock pulses will be counted in a measurement interval. Accordingly, by setting switch 32 to "90", comparator 30 will enable gate 36 at the end of every measurement period in which the average frequency (taken over 32 cycles) of the signal S1 equals or exceeds 3.15 MHz.

From the foregoing, it is evident that the rate at which measurements are made is directly proportional to the frequency of the signal S1, so that measurements are made more frequently as the frequency of S1 increases. This represents a significant advantage, particularly in video disc mastering systems, in that large frequency deviations are quickly detected by the "variable rate" technique of the present invention. If one were to use the conventional technique of measuring frequency directly by counting cycles during a fixed time period, then brief frequency excursions (less than the averaging period) might go undetected. In the present invention such frequency excursions significantly shorten the measurement period. As an example, a sixteen cycle burst of the signal S1 at a frequency of 6.30 MHz will shorten the measurement period to about 5,078 nanoseconds or one half of its nominal value at 3.15 MHz.

The pulses produced by gate 36 provide indications that the average frequency of 32 cycles of the signal S1 has exceeded the deviation limit set by switch 32 as determined during a variable measurement interval proportional to the frequency of signal S1. These "indicator" pulses could be applied directly to switch S1 for opening the path between the recording signal source 10 and recording unit 14. In accordance with a further aspect of the invention, it has been found advantageous to "ignore" the first one of two such sequential indicator pulses. This enhances the "confidence level" of the system by rejecting brief average frequency excursions of the signal S1 due, for example, to preemphasis induced overshoots. It has been found, in video disc mastering applications in particular, that an occasional brief overshoot above the nominal white level of 100 IRE units is acceptable whereas a prolonged overshoot is not acceptable. For this reason, the mastering system includes a "first pulse ignore" circuit which rejects occasional pulses produced by gate 36 and provides a further indicator pulse only upon the successive occurrence of two (or more) of the "indicator pulses" produced by gate 36.

The "first pulse ignore" circuit comprises a two bit shift register including two cascade connected flip flops 40, 42 an AND gate 44, and a delay element 46. The output of delay element 24 is delayed by the delay element 46 for 20 nanoseconds and applied to the clock inputs of flip flops 40 and 42. The "indicator" pulses of AND gate 36 are applied to the data (D) input of flip flop 40 and to one input of AND gate 44. The true (Q) output of flip flop 40 is connected to the data (D) input of flip flop 42 which is connected at the true (Q) output thereof to the other input of AND gate 44. The output of gate 44 is connected to switch 12 and via a monostable multivibrator 46 to a light emitting diode (LED) 48.

In operation, the shift register (flip flops 40 and 42) is clocked 20 nanoseconds after each measurement interval by means of delay element 46. The delay is included to allow sufficient "set-up" time for the first stage of the shift register. If gate 36 is enabled at the end of a measurement interval, flip flop 40 will be SET and will prime flip flop 42 to be SET at the end of the next measurement interval. If gate 36 is also enabled at that time both flip flops will be SET and gate 44 will be enabled signifying the sequential appearance of two deviation indicator pulses. Conversely, of gate 36 is not enabled at the end of the next measurement interval, then gate 44 will not be enabled and flip flop 40 will be RESET thereby removing the priming signal from the D input of flip flop 42. This will "clear" the shift register (reset flip flop 42) upon the occurrence of the next shift pulse (delayed MSB output of counter 20). To summarize, the indicator pulses produced by gate 36 are clocked into the shift register at the end of each measurement period. If two (or more) pulses occur in succession, the shift register will be loaded (flip flops 40 and 42 SET) and gate 44 enabled thereby providing a further pulse indicative of the sequence.

A visual indication of the occurrence of two sequential "indicator" pulses is provided by LED 48. Multivibrator 46 "stretches" or lengthens the pulses to enhance the visibility and may have a quasi-stable state of a few hundred milliseconds. A further monostable multivibrator 50 (having a shorter quasi-stable state) is interposed in the path between gate 44 and switch 12 for stretching the inhibit pulses applied to switch 12. The period of multivibrator 50 may be relatively short (e.g., a few hundred nanoseconds).

Various changes may be made to the deviation detector and to the overall recording system. Switch 12, for example, may be interposed in a baseband video signal path in recording signal source 10 if desired. The frequency of clock 28 and the number of stages in counters 20 and 26 may be changed to other suitable values. Detector 18 may be replaced with a nonfrequency doubling form of detector or another form of interface unit if desired. Switch 12 may be omitted if automatic protection of the recording transducer if not desired. The visual indicator (LED 48) may be replaced or augmented by an event counter or an event recorder. The delays provided by elements 24 and 46 are not critical and may be altered as needed to suit the settling times or propagation delays of the logic circuits employed in the detector.

In the recording system of FIG. 1, switch 12 is opened each time LED 48 is illuminated. The LED, in other words, provides the function of monitoring the status of switch 12 and both are controlled by the setting of thumbwheel switch 32. In accordance with a further aspect of the invention, it has been found advantageous to more quickly interrupt the recording signal S1 in cases of very large frequency deviations of the FM carrier to provide greater protection of the recording transducer in recording unit 14. The LED may then be used to provide a different function, namely, the function of predicting or anticipating such extreme FM signal deviations. By this means the recording system operator will be provided with an early warning that the FM signal deviations are nearing a critical stage and suitable corrective action (e.g., reducing the recording level) may be taken.

FIG. 2 illustrates how the system of FIG. 1 may be modified to meet the foregoing objectives. The modification comprises deletion of multivibrator 50 and the addition of a further thumbwheel switch 202, a BCD/Binary converter 204, a magnitude comparator 206, a flip flop 208 and an output terminal 210. Switch 202 is a two digit binary coded decimal (BCD) thumbwheel switch and is connected to converter 204 which converts the BCD switch output signals to a natural binary number "K" corresponding to the thumbwheel switch setting. Magnitude comparator 206 is connected to compare the number "C" produced by counter 26 with the number "K" produced by converter 204. If "C" is less than or equal to "K", comparator 208 supplies a high level signal to the data (D) input of flip flop 208. Flip flop 208 is clocked at the end of each measurement period by the delayed MSB pulse produced at the output of delay element 24 and supplied to the clock input of flip flop 208. As in the example of FIG. 1, the delay provided by element 24 provides sufficient time at the end of each measurement period of the magnitude comparator to stabilize or "settle". At that time, the flip flop will be SET if D is high or RESET if D is low. The "true" (Q) output of flip flop 208 is connected to an output terminal 210 and to the control input of switch 12. Terminal 210 may be connected to a visual indicator, event recorder or other suitable monitoring device. Switch 12 is disabled (opened) when flip flop 208 is SET, thereby interrupting the FM recording signal supplied to recording unit 14. For switches which require negative logic (i.e., a low level signal) to assume an open condition, the signal S2 may be taken from the complemented output Q̄ of flip flop 208 or an inverter may be interposed in the S2 signal path.

In operation, LED 48 will be illuminated (as previously explained) whenever the average FM frequency deviation is such that the average period, C, is less than (or equal to) the number N for two successive measurement intervals. Switch 32 (which controls N) may be set, illustratively, to a value of "90" to detect successive deviation of the FM signal above the assumed peak white level of 3.15 MHz. The exact setting, of course, depends also on the assumed clock frequencies and counter capacities as previously explained. One may than adjust the recording signal level (the peak deviation of signal S1) to a point where LED 48 just occasionally flashes to obtain an indication that the peak deviation, on average, is near the desired maximum for the recording system. If frequent flashing or continuous illumination of LED 48 occurs, the operator may assume that the recording level is too high and take appropriate corrective action.

To protect the recording unit 14 from extreme deviation of the FM signal, switch 202 should be set such that K is less than N. Recall that switch 12, as modified, is opened whenever C is less than (or equal to) K at the end of a single measurement interval, not two consecutive intervals. Thus, for large frequency deviation, switch 12 will respond more quickly than LED 48. One may calculate a specific setting for switch 202 for any desired maximum frequency deviation using the same procedure as described in connection with the system of FIG. 1.

What is claimed is:

1. A deviation detector for an FM signal modulated by a video signal, comprising:
   measuring means for measuring the average period of a given number of axis crossings of said FM signal to provide a binary number representative thereof at a measurement rate proportional to the average frequency of said FM signal to thereby provide an increased number of average period measurements as said frequency of said FM signal increases; and
   comparing means for comparing the binary number representative of each average period measurement with a predetermined number representative of a minimum desired average period to be detected to provide an indicator signal each time the measured average period is less than or equal to said predetermined number.

2. A deviation detector as recited in claim 1 wherein said video signal is subject to preemphasis and further comprising:
   means for detecting the successive occurrence of at least two of said indicator signals to provide a further indicator signal.

3. A deviation detector as recited in claim 2 further comprising:
   means for providing a visual indication of the occurrence of said further indicator signal.

4. A deviation detector as recited in claim 2 wherein said detecting means comprises:
   a shift register;
   means for clocking said shift register at the end of each measurement period;
   means for applying said first named indicator signal to a data input of said shift register; and
   means for deriving said further indicator signal from an output of said shift register.

5. A deviation detector; comprising:
   signal source means for providing an FM signal modulated in accordance with a video signal;
   first and second counters;
   means for supplying clock pulses to the first counter at a rate proportional to the frequency of said FM signal and for supplying clock pulses to the second counter at a substantially constant rate;
   means for comparing the count, C, of the second counter with a predetermined number, N, when the count of the first counter reaches a predetermined number, M, to provide an indicator signal having a binary state representative of the comparison; and
   means for placing each of said counters in a given initial condition subsequent to the count in the first counter reaching said predetermined number, M.

6. A deviation detector as recited in claim 5 wherein said video signal is subject to preemphasis and further comprising:
   means for detecting the successive occurrence of twor or more indicator signals having a given binary state to provide a further indicator signal.

7. A deviation detector as recited in claim 6 further comprising means for providing a visual indication for a predetermined length of time for each occurrence of said further indicator signal.

8. A deviation detector as recited in claim 6 further comprising
   output means coupled to said source means for receiving said FM signal; and
   circuit means responsive to said further indicator signal for interrupting the FM signal supplied to said output means.

* * * * *